United States Patent [19]

Sato et al.

[11] Patent Number: 5,243,259
[45] Date of Patent: Sep. 7, 1993

[54] MICROWAVE PLASMA PROCESSING APPARATUS

[75] Inventors: Junji Sato; Kazuo Suzuki; Shunichi Hirose; Takuya Fukuda, all of Hitachi; Satoru Todoroki, Yokohama, all of Japan

[73] Assignees: Hitachi, Ltd., Tokyo; Hitachi Engineering Service, Ibaraki, both of Japan

[21] Appl. No.: 798,901

[22] Filed: Nov. 27, 1991

[30] Foreign Application Priority Data

Nov. 29, 1990 [JP] Japan .................................. 2-332751

[51] Int. Cl.$^5$ ............................................. H05H 1/18
[52] U.S. Cl. .......................... 315/111.41; 315/111.21; 313/231.31; 204/298.37; 204/298.38
[58] Field of Search ...................... 315/111.21, 111.41, 315/111.81, 111.91; 313/231.31; 204/298.38, 298.37, 298.16

[56] References Cited

U.S. PATENT DOCUMENTS

| | | | |
|---|---|---|---|
| 4,611,121 | 9/1986 | Miyamura et al. | 315/111.41 X |
| 4,982,138 | 1/1991 | Fujiwara et al. | 315/111.41 |
| 5,024,716 | 6/1991 | Sato | 204/298.3 P X |
| 5,032,202 | 7/1991 | Tsai et al. | 315/111.41 X |
| 5,078,851 | 1/1992 | Nishihata et al. | 204/298.38 X |

FOREIGN PATENT DOCUMENTS 6464221  3/1989  Japan .

Primary Examiner—Eugene R. LaRoche
Assistant Examiner—Do Hyun Yoo
Attorney, Agent, or Firm—Antonelli, Terry, Stout & Kraus

[57] ABSTRACT

The present invention relates to a microwave plasma processing apparatus for processing such as thin film formation, etching, sputtering, and plasma oxidation, etc., on a surface of a processing object by utilizing a high density plasma generated by electron cyclotron resonance. A vacuum vessel of the apparatus, in which a microwave transmitted by a microwave guide is utilized for converting gas supplied to the vacuum vessel to plasma for the plasma processing of the processing object placed in the vacuum vessel, is formed in, such manner that the interior space of the vacuum vessel extends beyond the outer periphery of magnetic field generating coils, and the extended portion of the vessel is provided with a gas outlet for connection with an evacuation apparatus to evacuate the interior of the vacuum vessel to a desired vacuum degree. Accordingly, preferable evacuating characteristics can be obtained even in a case when a large amount of the reaction gas is supplied to the vacuum vessel in order to process a large size processing object, because the vacuum vessel in which the processing object is placed can be connected with the evacuation apparatus through a space and the same effect as if the evacuation apparatus is directly connected with the vacuum vessel is realized.

10 Claims, 3 Drawing Sheets

5,243,259

MICROWAVE PLASMA PROCESSING APPARATUS

BACKGROUND OF THE INVENTION

The present invention relates to a microwave plasma processing apparatus, and especially to a microwave plasma processing apparatus for thin film formation, etching, sputtering and plasma oxidation on the surface of processing objects by utilizing high density plasma generated with electron cyclotron resonance.

A conventional microwave plasma processing apparatus utilizing electron cyclotron resonance is disclosed, for instance, in JP-A-64-64221 (1989).

Referring to FIG. 1, the microwave plasma processing apparatus will be explained.

As FIG. 1 reveals, the microwave plasma processing apparatus 30 is provided with the microwave guide 40 which transmits a microwave from a microwave oscillator (not shown in the figure) in the direction indicated by the arrow 31, the vacuum vessel 39 into which the microwave 31 from the microwave guide 40 is supplied into interior through the microwave inlet window 41 and plasma processing is performed to the processing object 34 by supplying necessary gases from the gas inlets 32, 33 and generating plasma of the gases 42, the magnetic field generation coils 36, 37 which are arranged at an outer periphery of the microwave guide 40 and the vacuum vessel 39 and generate a magnetic field, and a gas outlet 38 which is formed at the side of the vacuum vessel 39 and connected to an evacuation apparatus for reducing an interior pressure of the vessel to a desired reduced pressure.

Next, operation of the microwave plasma processing apparatus will be explained.

The microwave plasma processing apparatus utilizes electron cyclotron motion which is generated by charging a magnetic field to a plasma. That is, when a magnetic field having a magnetic flux density which makes a cyclotron frequency of an electron coincide with a frequency of the microwave 31 from the microwave guide 40 is charged to the plasma by the magnetic field generation coils 36, 37, the resonance of the cyclotron motion of the electron and the microwave occurs, and consequently, a high density plasma is obtained. By utilizing the high density plasma, such processing as formation of a thin film on the surface of the processing object 34, etc., is performed.

When performing the processing, necessary gases 42 are supplied through the gas inlets 32, 33 in the direction indicated by the arrows as previously described. And, the vacuum vessel 39 is evacuated by the evacuation apparatus (not shown in the figure) such as a vacuum pump, etc., through gas outlet 38 which is provided at the side of the vacuum vessel 39 for maintaining the interior at a desired reduced pressure.

But, with the previously described conventional microwave plasma processing apparatus 30, sufficient evacuating speed is not obtainable when the apparatus uses a large amount of reaction gas because the gas outlet 38 is provided between the two magnetic field generation coils 36, 37 which are separated in the direction along the microwave transmittance at the outer periphery of the vacuum vessel 39.

For instance, the previously described microwave plasma processing apparatus 30 has the evacuation characteristics of reaction pressure of $1 \times 10^{-3}$ Torr. When using a silicon wafer of 100 mm diameter as, the processing object 34 and the reaction gas is supplied at 100 ml/min. and assuming a vacuum pump having an evacuating speed of 1800 l/sec as an ordinary vacuum pump, the evacuating conductance of the apparatus is about 4300 l/sec. Further, taking a case of supplying the reaction gas by 500 ml/min. in order to process larger objects for an example, although assuming that the reaction pressure is $3 \times 10^{-1}$ Torr, the evacuating conductance of the apparatus of about 5100 l/sec with two of the above described vacuum pumps becomes necessary and, consequently, a plurality of vacuum pumps for the microwave plasma processing apparatus 30.

As previously explained, the conventional microwave plasma processing apparatus 30 has a problem that a plurality of vacuum pumps are necessary in order to process large size processing objects because the evacuating speed was not sufficient in the case of the processing with supplying a large amount of the reaction gas.

SUMMARY OF THE INVENTION

The present invention has been made in view of the above described aspect, and the object is to provide a microwave plasma processing apparatus which is able to obtain preferable evacuation characteristics even though a large amount of reaction gas is supplied in order to process large size processing objects.

In accordance with the present invention to achieve the above described object, the interior space of the vacuum vessel is extended to beyond the outer periphery of the magnetic field generating means and is provided between at least two magnetic field generating means which are separated in the direction of the microwave transmission, and at least one gas outlet for connection with an evacuation apparatus is provided at the extended portion.

In accordance with the above described composition, preferable evacuation characteristics are obtained because the vacuum vessel in which the processing object is placed is connected with the evacuation apparatus through a large space and the same effect as direct connection of the vacuum vessel in which the processing object is placed to the evacuation apparatus is realized.

DESCRIPTION OF THE PREFERRED EMBODIMENTS

The present invention is described in detail based on the embodiments referring to the figures.

Figure 1:
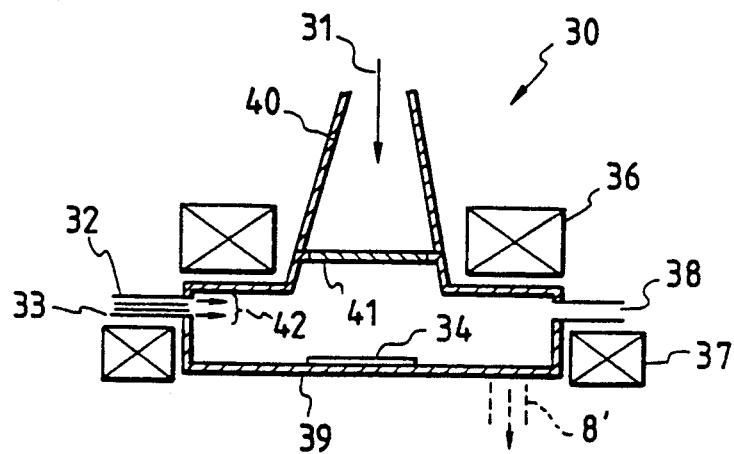
FIG. 1 is a schematic cross section of a conventional microwave plasma processing apparatus.
Figure 2:
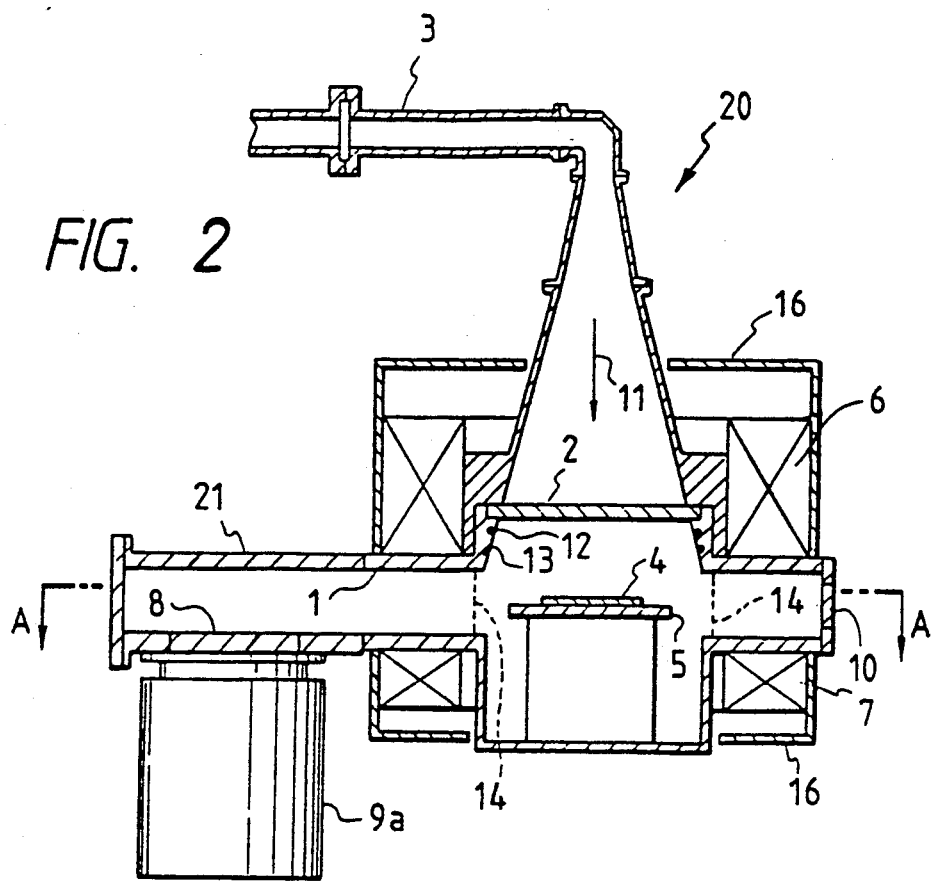
FIG. 2 is a schematic cross section illustrating one of the embodiments of the microwave plasma processing apparatus of the present invention.
Figure 3:
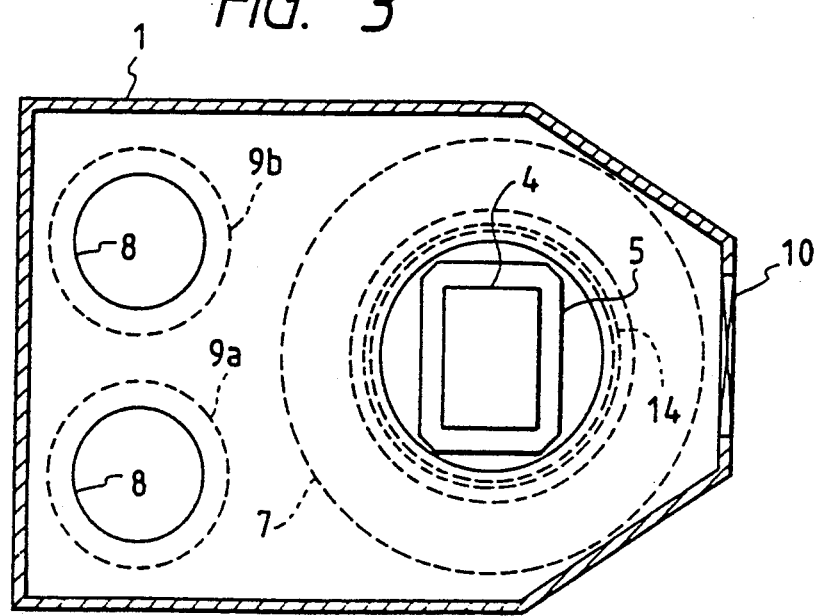
FIG. 3 is a schematic cross section along the A—A line of FIG. 2.

FIGS. 2 and 3 illustrate one of the embodiments of the present invention. The microwave plasma processing apparatus 20 of the present embodiment includes the microwave guide 3 which transmits a microwave from a microwave oscillator (not shown in the figure) in the direction indicated by the arrow 11, the vacuum vessel 1 in which supplied gas is converted to plasma by utilizing the microwave from the microwave guide 3 and plasma processing is performed the processing object 4 on the holder 5, the microwave inlet window 2 which separates the vacuum vessel 1 and the microwave guide 3 spatially, passes the microwave, and maintains the vacuum, a magnetic field generating means which is arranged at the outer periphery of the microwave guide 3 and the vacuum vessel 1, and comprises the magnetic field generation coils 6, 7 for magnetic field generation, the vessel 21 which is formed by an extension of internal space of the vacuum vessel 1 beyond the outer periphery of the magnetic field generation coils 6, 7 between the magnetic field generation coils 6, 7 and in parallel to the processing object 4, the gas outlet 8 which is formed at the vessel 21 and connected with an evacuation apparatus comprising the vacuum pumps 9a, 9b for evacuation of interior of the vacuum vessel 1 and the vessel 21 to a desired vacuum degree, the reaction gas inlets 12, 13 for supplying the reaction gas into the vacuum vessel 1, a magnetic shielding means such as the magnetic shielding plate 16, etc., which are provided at the outer side of the magnetic field generation coils 6, 7, and a microwave shielding means comprising the microwave shielding net 14 which passes the gas but shields the microwave is provided between a plasma processing portion near the processing object 4 in the vacuum vessel 1 and the evacuating space. The above described vessel 21 is provided for forming a vacuum maintainable space between the magnetic field generation coils 6, 7, and may be manufactured in a body with the vacuum vessel 1 or may be connected with the vacuum vessel 1 hermetically. As FIG. 3 reveals, the outer periphery of the vacuum vessel 1 and the vessel 21 is formed larger than the outer diameter of the magnetic field generation coils 6, 7.

Next, effects of the present embodiment of the microwave plasma processing apparatus 20 will be explained with its operation.

A microwave is transmitted into the interior of the vacuum vessel 1 through the microwave inlet window 2. The microwave and a magnetic field distribution formed by the magnetic field generation coils 6, 7, cause an electron cyclotron resonance point in space between the processing object 4 and the microwave inlet window 2. The reaction gas is supplied through the reaction gas inlets 12, 13 in the space, and plasma processing is performed.

For instance, the processing condition for a 200 mm×270 mm base is such that a total quantity of reaction gas is 500 ml/min. and a vacuum degree is $3 \times 10^{-3}$ Torr.

In order to realize the evacuation characteristics of the above described case, an evacuation space is formed by a vessel 21 which includes the processing object 4 and is extended toward a spacer approximately parallel to the processing object 4 between the two magnetic field generation coils 6, 7, which are arranged with an uniform interval in the microwave transmitting direction of the vacuum vessel 1, and the gas outlet 8 is provided at a part of the vessel 21 which is extended beyond of the outer periphery of the magnetic field generation coils 6, 7, and connected with the vacuum pumps 9a, 9b. Consequently, the same effect as if the vacuum vessel 1 in which the processing object 4 is placed is able to be directly connected with the vacuum pumps 9a, 9b is obtained. That is, since the processing object 4 and the vacuum pumps 9a, 9b are able to be connected in a space, preferable evacuation characteristics are obtained. Further, as the number of the vacuum pumps can be increased or decreased depending on the wideness of the extended portion (the vessel 21), a most preferable evacuation system corresponding to the quantity of the reaction gas can be realized.

In the present embodiment, the above described processing condition is realized by making the evacuation conductance of the vacuum vessel 1 5100 l/sec. and utilizing two vacuum pumps 9a, 9b having an evacuation speed of 1800 l/sec.

The magnetic field generation coils 6, 7 control one of the processing conditions, namely, the magnetic field distribution inside of the inner periphery of the coils. But, as a magnetic field outside of the outer periphery of the coils is not necessary, for operation, installation, of a magnetic shielding plate 16 outside of the magnetic field generation coils 6, 7 causes no change in its performance. By extending the vacuum vessel 1 beyond the outer periphery of the magnetic field generation coils 6, 7 and providing the vacuum pumps at the extended portion, the vacuum pumps can be installed outside of the magnetic shield, consequently, magnetic flux crossing over the vacuum pumps can be reduced and blade heating of the vacuum pumps, etc., can be eliminated.

Further, the microwave transmitted into the vacuum vessel 1 through the microwave inlet window 2 is shielded by the microwave shielding net 14, which passes gas but shields the microwave, installed between the plasma processing portion of the vacuum vessel 1 and the evacuation space, and accordingly, leakage of the microwave to the evacuation space in the vacuum vessel 1 is decreased and loss is reduced. The microwave shielding net 14 is a metallic net plate, which is sufficiently small comparing with the wavelength, 123 mm, of the microwave (2.45 GHz), and it shields the microwave but passes the gas. Accordingly, installation of the microwave shielding net 14 so as to surround the processing object 4 in the vacuum vessel 1 along the microwave transmitting direction as shown in FIG. 3 prevents the microwave from leaking to the evacuating space in the vacuum vessel 1. Consequently, microwave loss of the vacuum vessel 1 can be reduced.

Figure 4:
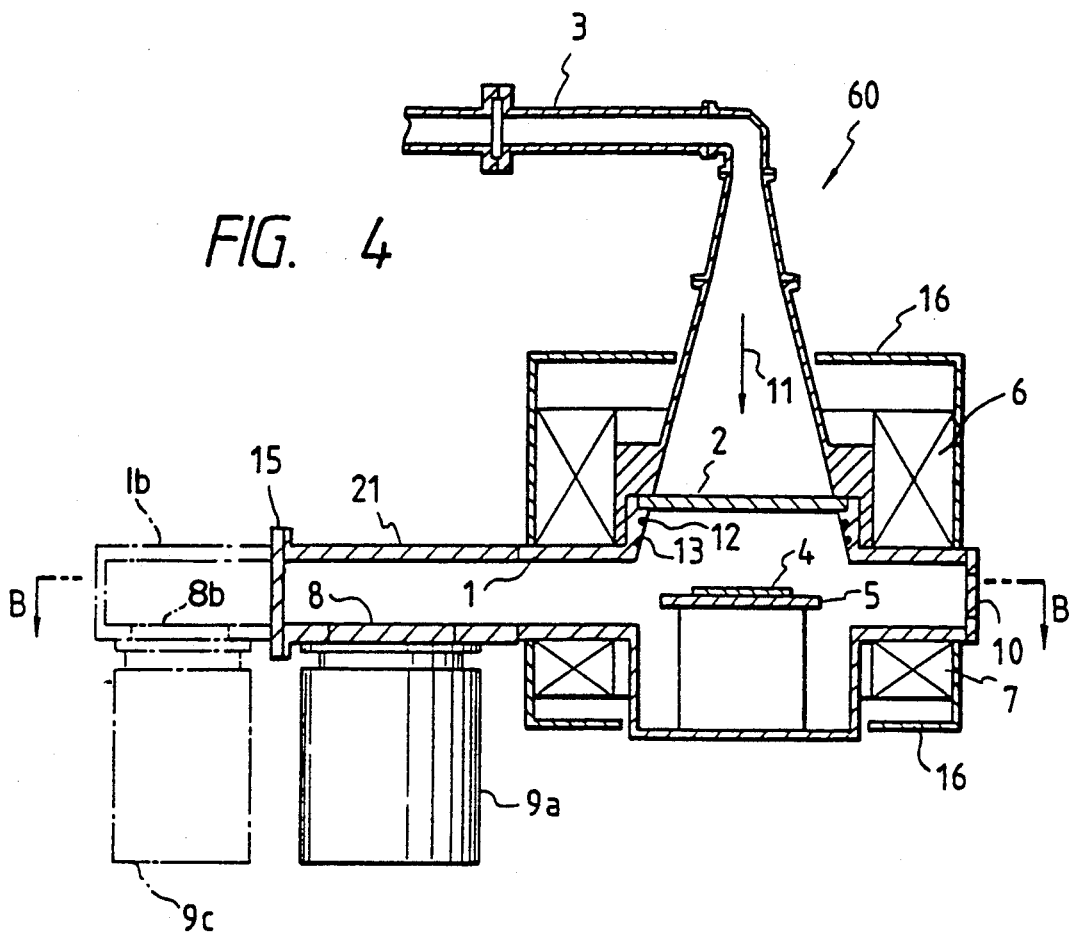
FIG. 4 is a schematic cross section illustrating another embodiment of the microwave plasma processing apparatus of the present invention.
Figure 5:
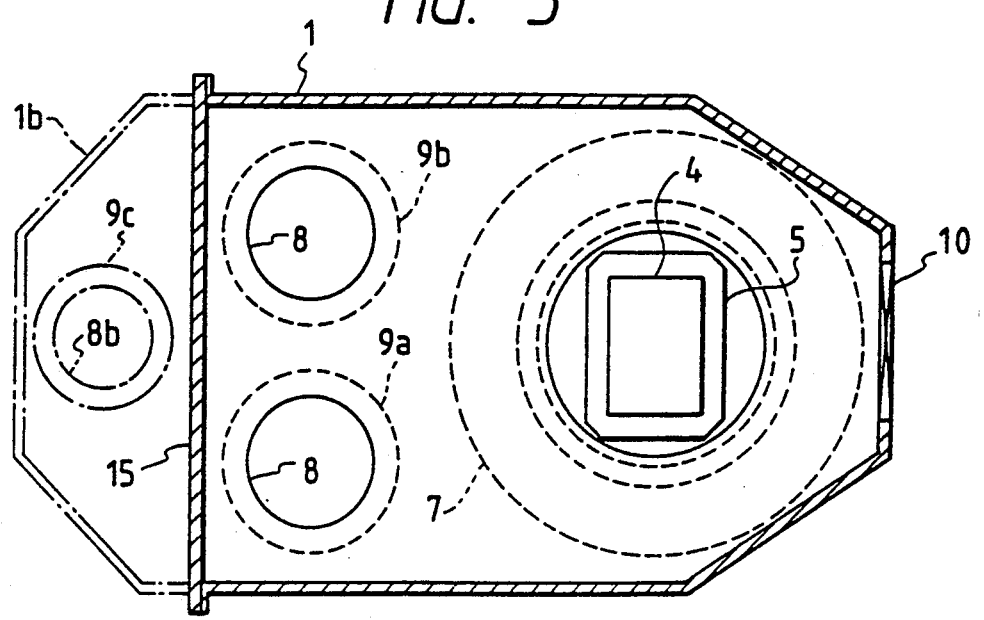
FIG. 5 is a schematic cross section along the B—B line of FIG. 4.

Next, another embodiment of the microwave plasma processing apparatus 60 relating to the present invention is explained referring to FIGS. 4 and 5.

In accordance with the present embodiment shown in FIGS. 4 and 5, the vessel 21 which is the extended portion of the vacuum vessel 1 has a flange structure at its an end, and the flange structure is covered with a blind board 15 in a detachable manner. As the other structure is, as same as the previous embodiment, explanation thereof is omitted.

With the structure of the present embodiment, the interior of the vacuum vessel 1 can be inspected without detaching the magnetic field generation coils 6, 7 by detaching only the blind board 15 when interior inspection becomes necessary during a maintenance operation.

Moreover, when the amount of the reaction gas is desired to be increased remarkably, it is necessary to increase the number of the vacuum pumps in order to keep the desired vacuum in the vacuum vessel 1. In the above described case, an additional vacuum pump 9c is easily provided by detaching the blind board 15 and connecting the additional extension vessel 1b having the additional vacuum pump 9c connected to an additional gas outlet 8b with the flange portion at the end of the vessel 21 as shown by the one dot chain line in FIGS. 4 and 5. Therefore, the amount of the reaction gas can be remarkably increased without changing the desired vacuum degree in the vacuum vessel 1.

In accordance with the microwave plasma processing apparatus relating to the present invention, the vacuum vessel, in which the microwave transmitted by the microwave guide is utilized for converting the supplied gas to plasma for plasma processing of the processing object placed in the interior, is formed in such manner that the interior space is extended beyond the outer periphery of the magnetic field generating means, and the extended portion of the vessel is provided with the gas outlet for connection with the evacuation apparatus to evacuate the interior of the vacuum vessel to the desired vacuum degree. Accordingly, preferable evacuating characteristics can be obtained even in a case when a large amount of the reaction gas is supplied to the vacuum vessel in order to process a large size processing object, because, since the vacuum vessel in which the processing object is placed can be connected with the evacuation apparatus through a space, the same effect as if the evacuation apparatus is directly connected with the vacuum vessel is realized.

What is claimed is:

1. A microwave plasma processing apparatus comprising:
   a vacuum vessel for receiving an object to be subjected to plasma processing;
   a microwave guide for transmitting a microwave into the vacuum vessel in a microwave transmission direction;
   first magnetic field generating means disposed around the vacuum vessel and the microwave guide for generating a first magnetic field in the vacuum vessel; and
   second magnetic field generating means disposed around the vacuum vessel for generating a second magnetic field in the vacuum vessel;
   wherein the vacuum vessel includes:
      a gas inlet for supplying gas into the vacuum vessel,
      an evacuation extension extending beyond an outer periphery of the first magnetic field generating means and an outer periphery of the second magnetic field generating means, and
      a gas outlet in the evacuation extension for enabling the vacuum vessel to be evacuated through the evacuation extension and the gas outlet; and
   wherein the microwave transmitted into the vacuum vessel, the first magnetic field in the vacuum vessel, and the second magnetic field in the vacuum vessel interact to convert the gas supplied into the vacuum vessel into a plasma by electron cyclotron resonance, thereby subjecting the object disposed in the vacuum vessel to the plasma processing.

2. A microwave plasma processing apparatus according to claim 1, wherein the gas outlet is located entirely beyond the outer periphery of the first magnetic field generating means and the outer periphery of the second magnetic field generating means.

3. A microwave plasma processing apparatus according to claim 1, wherein the object disposed in the vacuum vessel has a surface to be subjected to the plasma processing, and wherein the evacuation extension extends in a direction substantially parallel to the surface of the object.

4. A microwave plasma processing apparatus according to claim 1, wherein the vacuum vessel further includes:
   a plasma processing portion in which the gas supplied into the vacuum vessel is converted into the plasma by the electron cyclotron resonance; and
   microwave shielding means disposed between the plasma processing portion and the evacuation extension for preventing the microwave transmitted into the vacuum vessel from entering the evacuation extension and permitting the gas in the plasma processing portion to enter the evacuation extension to be evacuated through the gas outlet.

5. A microwave plasma processing apparatus according to claim 1, further comprising magnetic shielding means surrounding the first magnetic field generating means and the second magnetic field generating means for preventing the first magnetic field and the second magnetic field from extending beyond the magnetic shielding means.

6. A microwave plasma processing apparatus according to claim 1, wherein the evacuation extension has an open an located beyond the outer periphery of the first magnetic field generating means and the outer periphery of the second magnetic field generating means, and wherein the vacuum vessel further includes:
   a flange structure on the open end of the evacuation extension; and
   a blind board detachably mounted on the flange structure for covering the open end of the evacuation extension.

7. A microwave plasma processing apparatus according to claim 1, wherein the evacuation extension has an open end located beyond the outer periphery of the first magnetic field generating means and the outer periphery of the second magnetic field generating means, and wherein the vacuum vessel further includes:
   a flange structure on the open end of the evacuation extension;
   an additional evacuation extension detachably mounted on the flange structure and communicating with the open end of the evacuation extension; and
   an additional gas outlet in the additional evacuation extension for enabling the vacuum vessel to be evacuated through the evacuation extension, the additional evacuation extension, ad the additional gas outlet.

8. A microwave plasma processing apparatus comprising:
   a vacuum vessel for receiving an object to be subjected to plasma processing;
   a microwave guide for transmitting a microwave into the vacuum vessel; and
   magnetic field generating means disposed around the vacuum vessel and the microwave guide for generating a magnetic field in the vacuum vessel;
   wherein the vacuum vessel includes:
      a gas inlet for supplying gas into the vacuum vessel,
      an evacuation extension extending beyond an outer periphery of the magnetic field generating means, and
      a gas outlet in the evacuation extension for enabling the vacuum vessel to be evacuated through the evacuation extension and the gas outlet, the gas outlet being located entirely beyond the outer periphery of the magnetic field generating means; and wherein the microwave transmitted into the vacuum vessel and the magnetic field in the vacuum vessel interact to convert the gas supplied into the vacuum vessel into a plasma by electron cyclotron resonance, thereby subjecting the object disposed in the vacuum vessel to the plasma processing.

9. A microwave plasma processing apparatus comprising:
- a vacuum vessel for receiving an object to be subjected to plasma processing;
- a microwave guide for transmitting a microwave into the vacuum vessel in a microwave transmission direction;
- first magnetic field generating means disposed around the vacuum vessel and the microwave guide for generating a first magnetic field in the vacuum vessel; and
- second magnetic field generating means disposed around the vacuum vessel for generating a second magnetic field in the vacuum vessel;
- wherein the vacuum vessel includes;
  - a gas inlet for supplying gas into the vacuum vessel,
  - an evacuation extension extending beyond an outer periphery of the first magnetic field generating means and an outer periphery of the second magnetic field generating means, and
  - a gas outlet in the evacuation extension for enabling the vacuum vessel to be evacuated through the evacuation extension and the gas outlet;
- wherein the microwave transmitted into the vacuum vessel, the first magnetic field in the vacuum vessel, and the second magnetic field in the vacuum vessel interact to convert the gas supplied into the vacuum vessel into a plasma by electron cyclotron resonance, thereby subjecting the object disposed in the vacuum vessel to the plasma processing; and
- wherein the first magnetic field generating means an the second magnetic field generating means are separated from each other in the microwave transmission direction, thereby defining a space between the first magnetic field generating means and the second magnetic field generating means, and wherein the evacuation extension extends through the space between the first magnetic field generating means and the second magnetic field generating means beyond the outer periphery of the second magnetic field generating means.

10. A microwave plasma processing apparatus comprising:
- a vacuum vessel for receiving an object to be subjected to plasma processing;
- a microwave guide for transmitting a microwave into the vacuum vessel in a microwave transmission direction;
- first magnetic field generating means disposed around the vacuum vessel and the microwave guide for generating a first magnetic field in the vacuum vessel;
- second magnetic field generating means disposed around the vacuum vessel for generating a second magnetic field in the vacuum vessel; and
- magnetic shielding means surrounding the first magnetic field generating means and the second magnetic field generating means for preventing the first magnetic field and the second magnetic field from extending beyond the magnetic shielding means;
- wherein the vacuum vessel includes:
  - a gas inlet for supplying gas into the vacuum vessel,
  - an evacuation extension extending beyond an outer periphery of the first magnetic field generating means and an outer periphery of the second magnetic field generating means, and
  - a gas outlet in the evacuation extension for enabling the vacuum vessel to be evacuated through the evacuation extension and the gas outlet;
- wherein the microwave transmitted into the vacuum vessel, the first magnetic field in the vacuum vessel, and the second magnetic field in the vacuum vessel interact to convert the gas supplied into the vacuum vessel into a plasma by electron cyclotron resonance, thereby subjecting the object disposed in the vacuum vessel to the plasma processing; and
- wherein the evacuation extension extends beyond an outer periphery of the magnetic shielding means, and wherein the gas outlet in the evacuation extension is located entirely beyond the outer periphery of the magnetic shielding means such that the magnetic shielding means prevents the first magnetic field and the second magnetic field from affecting a vacuum pump connected to the gas outlet.

* * * * *